United States Patent

Lesthievent et al.

[19]

[11] Patent Number: 6,125,155
[45] Date of Patent: Sep. 26, 2000

[54] BROAD-BAND DIGITAL FILTERING METHOD AND A FILTER IMPLEMENTING THE METHOD

[75] Inventors: Chantal Lesthievent, Portet/Garonne; Patrick Oudart, Cugnaux; Claudine Flament, Villeneuve-Tolosane; Eric Belis, Toulouse, all of France

[73] Assignee: Alcatel Espace, Nanterre Cedex, France

[21] Appl. No.: 08/733,517

[22] Filed: Oct. 18, 1996

[30] Foreign Application Priority Data

Oct. 19, 1995 [FR] France .................................. 95 12295

[51] Int. Cl.[7] ........................................................ H04B 1/10
[52] U.S. Cl. ...................... 375/350; 375/349; 364/724.1; 364/724.13
[58] Field of Search ............................ 327/91, 237, 241; 364/724.01, 724.1, 724.13; 370/210, 484; 375/232, 229, 349, 350

[56] References Cited

U.S. PATENT DOCUMENTS

| | | | |
|---|---|---|---|
| 3,997,772 | 12/1976 | Crochiere et al. | 364/724.1 |
| 4,020,332 | 4/1977 | Crochiere et al. | 364/724.1 |
| 4,725,972 | 2/1988 | Gockler | 364/724 |
| 5,535,240 | 7/1996 | Carney et al. | 375/219 |
| 5,592,517 | 1/1997 | Camp et al. | 375/350 |

FOREIGN PATENT DOCUMENTS

0080712A2  6/1983  European Pat. Off. .
0530468A2  3/1993  European Pat. Off. .

OTHER PUBLICATIONS

A. Luthra et al, "Sampling–Rate Conversion of Video Signals", SMPTE Journal, vol. 100, No. 11, Nov. 1, 1991, pp. 869–879.

K. C. Lo et al, "Fast Computational Algorithm in Parallel Random Sampling", *Electronics Letters*, vol. 28, No. 12, Jun. 4, 1992, pp. 1115–1117.

*Primary Examiner*—Stephen Chin
*Assistant Examiner*—Joseph Roundtree
*Attorney, Agent, or Firm*—Sughrue, Mion, Zinn, Macpeak & Seas, PLLC

[57] ABSTRACT

A digital filter method comprising the following steps: input signal data x(n) is sampled at sampling frequency Fe and shared between and stored in Q memories of shift register of FIFO type associated with the Q branches of the filter. The filter coefficients $g_m(p)$ are stored in at least one other memory referred to as a "coefficient" memory. Interpolation by L followed by decimation by M makes it possible to reduce the working frequency of the filter to the output frequency Fs=(L/M)Fe with L/M<1. Data samples x(n) are multiplied by the coefficients $g_m(p)$ at the rate Fs. According to the invention, the data samples x(n) in each branch remain present for a plurality of multiplications ≈Fe/Q, and the coefficients are rotated in each branch by address permutation in the coefficient memory at each clock period. The invention proposes various devices implementing the method. Applications in radar and in telecommunications.

8 Claims, 6 Drawing Sheets

BROAD-BAND DIGITAL FILTERING METHOD AND A FILTER IMPLEMENTING THE METHOD

The field of the invention is that of digital signal processing and more particularly that of digitally filtering digitally-encoded signals. More precisely, the invention relates to a technique of filtering high data rate and/or broad-band signals, at frequencies up to several hundred MHz, and it proposes a circuit architecture using said filter technique, and also an implementation thereof in an application specific integrated circuit (ASIC).

BACKGROUND OF THE INVENTION

High data rate and/or broad-band digital signal processing makes it possible to extract a large quantity of information either by transmitting radio signals over a noisy channel, or else by demultiplexing frequency division multiplex (FDM) signals in telecommunications applications. The digital filtering technique of the invention is also applicable in systems for receiving radar signals, e.g. synthetic aperture radars, Doppler radars, or for extracting radar signatures.

Techniques for digitizing signals and processing them digitally provide the systems that use them with a high degree of flexibility. Unfortunately, a limitation of such systems is that the maximum rate at which data can be processed is tied to the input data sampling frequency Fe.

In known systems, the sampling frequency can be increased, but with a corresponding cost of an increase in mass, power consumption, complexity, and cost of the system up to a limit imposed by the technological state of the art of the components used. This limit appears to be unsurpassable using present-day technologies and known architectures.

OBJECTS AND SUMMARY OF THE INVENTION

An object of the invention is to surpass the performance limits presently imposed on known digital filtering systems, in particular concerning maximum processing speed.

Several digital filter architectures are known in the prior art. A brief description of known systems is useful in obtaining a better understanding of the principles and the advantages of the invention.

Figure 1:
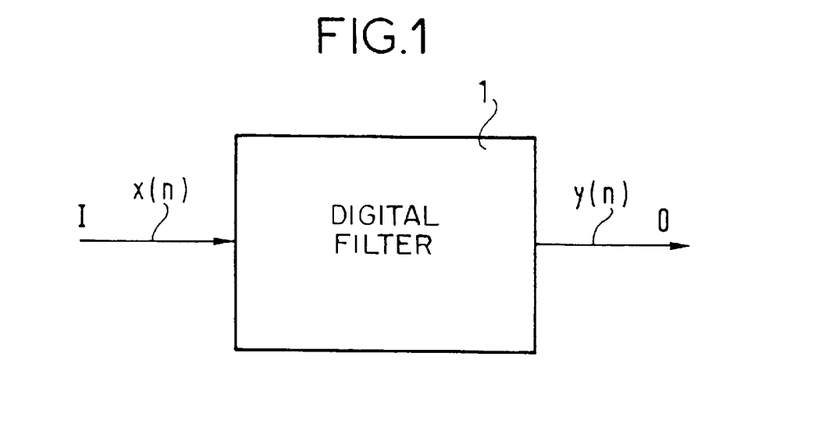
FIG. 1, described above, is a block diagram of a conventional digital filter of the prior art.

FIG. 1 shows a conventional digital filter structure, in which an input signal x(n) is sampled at a sampling frequency Fe, and is applied to the input I of a filter 1 that is characterized by its sampled impulse response which gives a set of coefficients h(n), and the filtered signal y(n) is delivered to the output O of the filter 1, being sampled at the same frequency Fe:

$$y(n) = \sum_{i=0}^{N-1} h(i) \cdot x(n-i)$$

In this notation, N represents clock period increments and takes integer values which are multiplied by a clock cycle duration that is inversely proportional to the sampling frequency Fe and N represents the total number of clock periods in the data sample being filtered.

One application of digital filtering consists in reducing the output sampling frequency Fs to a value that is as close as possible to the Shannon frequency, i.e. Fs≈2B where B is the bandwidth of the signal. This technique is advantageous for applying filtering to a signal of bandwidth (B) that is narrow relative to the input sampling bandwidth, i.e. Fe>B. This sampling frequency ratio between the input signal and the output signal can be expressed in the most general case by the following relationship:

$$F_s = \frac{L}{M} Fe, \text{ with } \frac{L}{M} < 1, \text{ integer } L \text{ and } M$$

Figure 2:
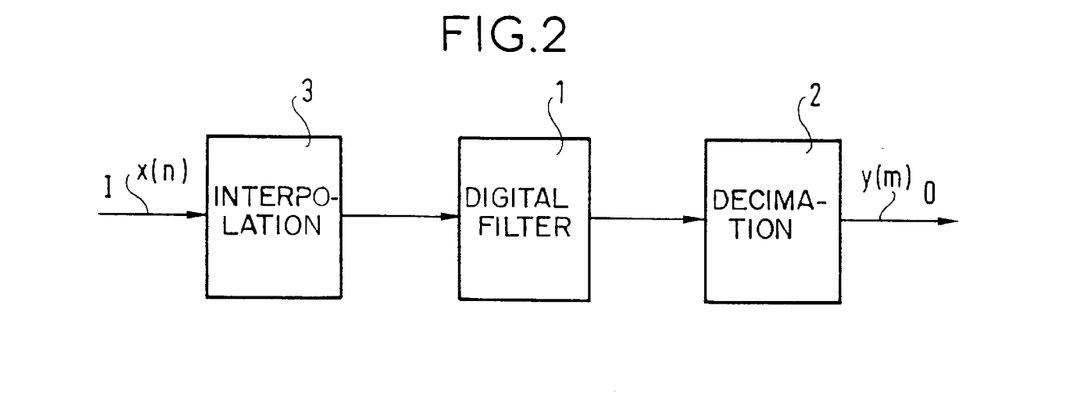
FIG. 2, described above, is a block diagram of another embodiment of a conventional digital filter of the prior art, with interpolation followed by decimation.

As shown in FIG. 2, the techniques normally used for this type of processing combine an interpolation operation 3 followed by a decimation operation 2. The input signal must first be interpolated (3) and filtered at the frequency L*Fe, and then decimated (2) by M in order to obtain filtered data y(m) at the output O and at the output sampling rate Fs. That method is difficult to implement, particularly when the sampling frequency Fe is high, or when the value of L is large, giving rise to a large increase in processing rate.

Figure 3:
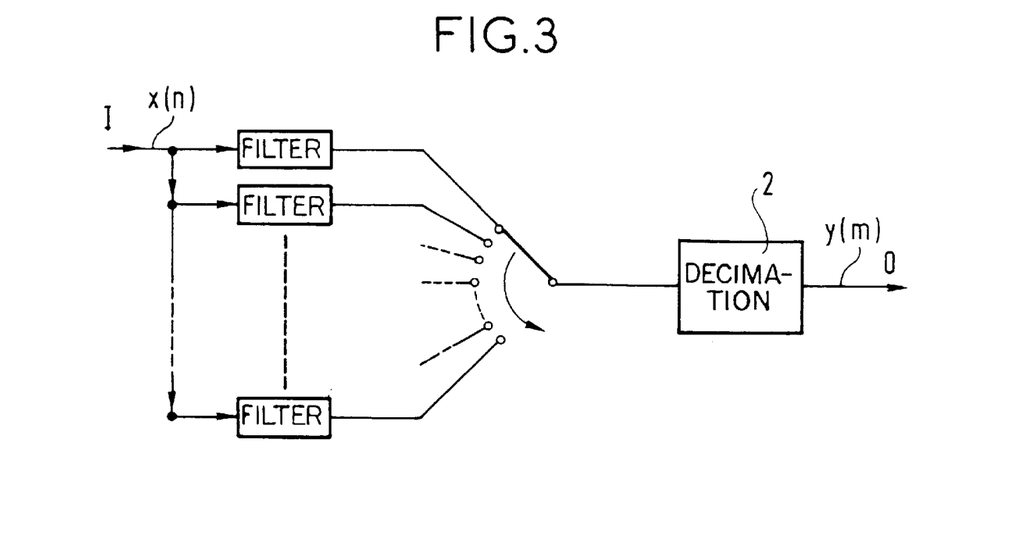
FIG. 3, described above, is a block diagram of another embodiment of an interpolator digital filter of the prior art, with L sub-filters operating at Fe, followed by multiplexing and decimation.

A known improvement over that system can be obtained by using a polyphase filter structure for performing the interpolation/filtering function, thereby enabling the filtering operation to be performed at the input sampling frequency Fe. One such structure is shown in FIG. 3. For each input data sample x(n), each of the L branches [$p_o(n)$, $p_1(n)$, ..., $p_{L-1}(n)$] of the polyphase array contributes to generating one of the L outputs of the L branches, each branch thus operating at the input sampling frequency Fe. The interpolated frequency L*Fe appears only during output multiplexing of the data after filtering in the L branches, each branch thus constituting a sub-filter $p_\rho(n)$, $\rho=1, 2, \ldots, L-1$, corresponding to versions of the filter h(n) that have been decimated by L. Each sub-filter is constituted by a set of N/L coefficients of the filter h(n).

The major drawback of the structure described with reference to FIG. 3 is that it requires the provision of L global filter stages or sub-filters [$p_o(n)$, $p_1(n)$, ..., $p_{L-1}(n)$], each having a working frequency which is the input sampling frequency Fe, and together associated with data multiplexing that operates at the interpolated frequency L*Fe. Also, that structure computes and delivers a large number of samples y(i) which are not retained at the output after decimation by M (2). The data y(m) retained at the output 0 is delivered at the rate Fs=(L/M)Fe.

Figure 4:
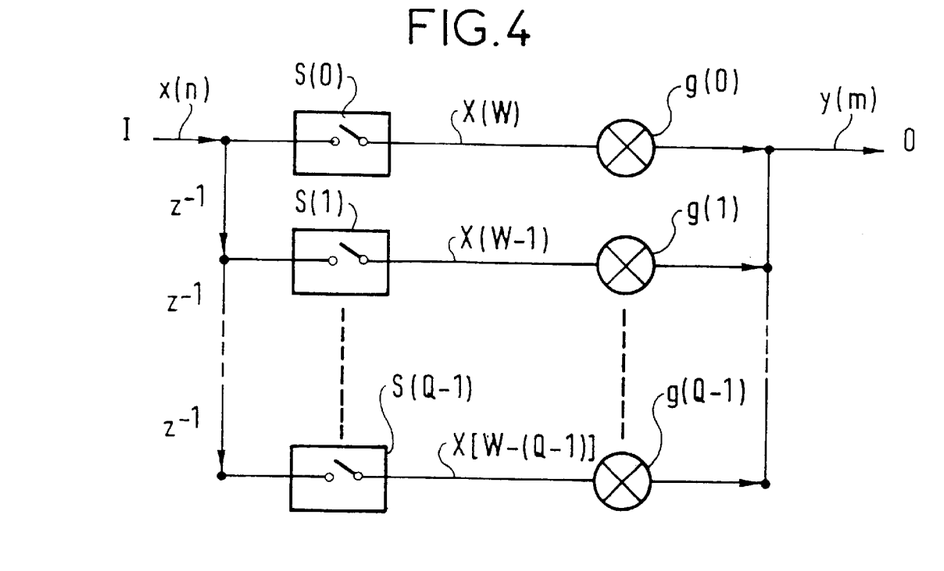
FIG. 4, described above, is a block diagram of another embodiment of a digital filter of the prior art, having Q stages operating at Fe and fed by an input data flow using a sample-and-hold mechanism, followed by multiplexing.

Another improvement of the system of FIG. 3 consists of computing only those samples which are retained at the output, i.e. useful samples y(m). The working frequency of the filters then becomes the output sampling frequency Fs, where Fs=(L/M)Fe, but that requires changes to be made in the processing. In particular, it is then necessary to re-sample the input samples x(n) and to manage the filter coefficients differently in order to obtain a structure that is equivalent to the conventional structure. Such a system is shown in FIG. 4.

The filter architecture comprises Q physical stages with the input data x(n) being shared over all of the stages by means of shift registers, and with the Q stages being summed to restore the filtered signal y(n) at the output O. However, the input data x(n) presented to the input of each stage is selected by means of an array of switches S(0), S(1), ..., S(Q-1) which are activated at the output frequency rate Fs. The selected samples are then multiplied by the filter coefficients.

To take the interpolation ratio L/M into account, the values of the coefficients applied to each stage of the filter vary over time. To enable such an architecture to function, it is necessary to select the number N of coefficients of the filter h(n) to be a multiple of the interpolation ratio L:

N=Q*L. The structure obtained is a finite impulse response (FIR) filter structure with time-varying coefficients. The coefficients applied over time to each of the filter stages are $g_{m\oplus L}(0), g_{m\oplus L}(1), \ldots g_{m\oplus L}(Q-1)$ and the data applied to each stage are as follows:

$$x(W), x(W-1), \ldots, x(W-[Q-1]),$$

with $$W = \left[\frac{mM}{L}\right],$$

respectively

The output samples y(m) are thus given by the following relationship:

$$y(m) = \sum_{n=0}^{Q-1} g_{m\oplus L}(n) \cdot x(W-n), \text{ with } W = \left[\frac{mM}{L}\right]$$

This relationship shows that y(m) is the weighted sum of a sequence of Q samples x(n) starting at n=W, i.e. with x(mM/L). The sets of filter coefficients $g_m$ vary periodically over time $\underline{p}$:

$$g_m(p)=h(pL+mM\oplus L)$$

where the symbol ⊕ designates the modulo operation.

That system nevertheless suffers from major drawbacks associated with using digital sample-and-hold and with the need to manage the lack of synchronism between the sampling frequencies Fe and Fs, and also the flow of input data x(n) at the frequency Fe over the various branches of the filter.

When the filter is to be programmable, it is difficult or even impossible to synthesize a clock Fs whose value is an exact fraction of the reference frequency Fe. Also, when it turns out to be necessary to re-sample the input data, it is important to ensure accurate phase coherence between Fe and Fs in order to avoid any possible slip between the clocks which would have the consequence of making the processing erroneous.

In addition, when the input sampling frequency Fe is high, the flow of data between the various branches of the filter requires high speed technology to be used and which means that the band cannot always be processed. These improvements naturally impose penalties in terms of cost and increased complexity, while performance and reliability can still be problematical. Also, causing the input data to flow over the Q different branches of the filter requires Q cycles of the clock Fe, i.e. (N/M) cycles of the clock Fs.

An object of the invention is to provide a digital filtering method capable of operating at a frequency Fs lower than the input sampling frequency Fe without generating products that are not retained at the output after decimation, and without relying on digital sample-and-hold circuitry.

Another object of the invention is to provide a digital filtering method having an output processing and sampling frequency Fs different from its input sampling frequency Fe, and in which the ratio Fs/Fe of these frequencies can be arbitrary.

Another object of the invention is a digital filtering method in which the time relationship of said frequencies can be arbitrary and thus asynchronous.

Another object of the invention is to propose a digital filtering method having an output sampling frequency Fs that is lower than its input sampling frequency, but without causing data to flow over different branches of the filter. In particular, in the invention, each input data sample is applied to a single branch of the filter.

To these ends, the invention provides a digital filtering method comprising the following steps:

input signal data x(n) is sampled at the input sampling frequency Fe and is shared between and stored in a plurality of Q memories of shift register or FIFO type, respectively associated with the Q branches of the filter;

the filter coefficients $g_m(p)$ are stored in at least one other memory referred to as a "coefficient" memory;

interpolation by L is performed on each branch;

data samples x(n) are multiplied by the coefficients $g_m(p)$ at the rate of the output frequency Fs; and there follows decimation by M, enabling the working frequency of the filter to be lowered to the output frequency Fs=(L/M)Fe, where L and M are integers and L/M<1.

According to an important characteristic of the invention, the data samples x(n) in each branch remain present for a plurality ≈Fe/Q, of multiplications and coefficients are rotated in each branch by permutation of addresses in said coefficient memory at each clock period.

In a variant, the method of the invention can be implemented in a parallel architecture comprising a plurality of filters operating on the principles specified above, with synchronous sequencing between the parallel filters.

In another variant, a plurality of any of the above parallel filters can be connected in cascade.

The invention also provides circuit architectures for implementing the method of the invention.

BRIEF DESCRIPTION OF THE DRAWINGS

Other characteristics and advantages of the invention appear on reading the following detailed description of various implementations given below with reference to the accompanying drawings, in which.

In all of the figures given by way of non-limiting example and showing various implementations of the invention or main varieties thereof, the same references are used to refer to the same elements, and the figures are not always to scale for reasons of clarity.

MORE DETAILED DESCRIPTION

Figure 5:
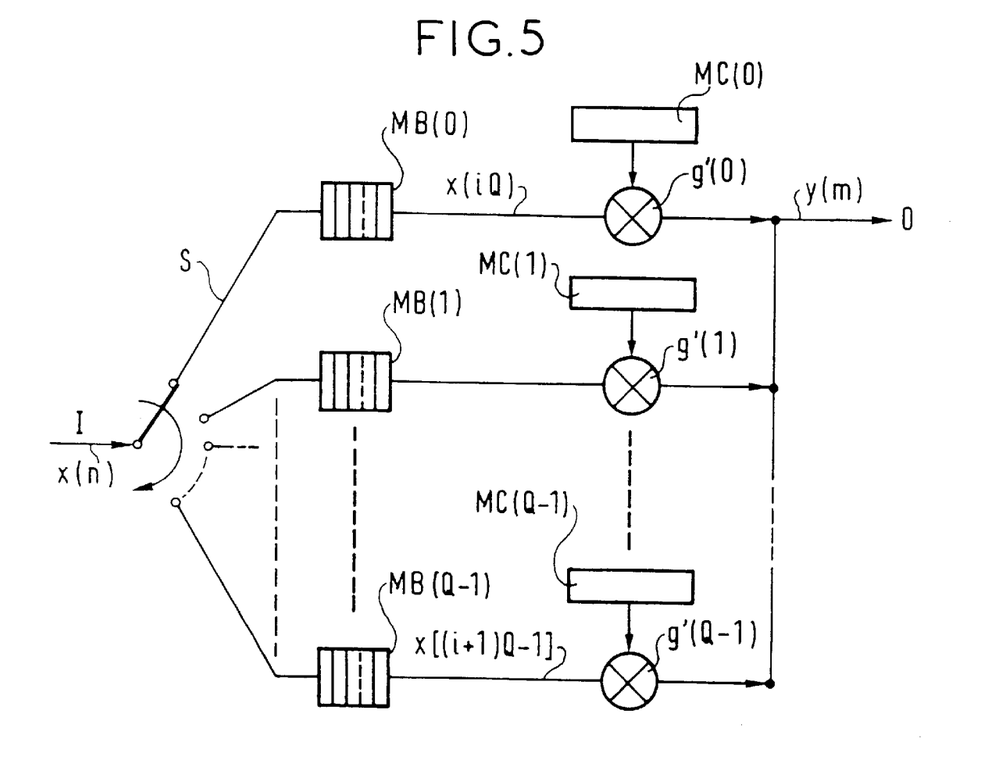
FIG. 5 is a block diagram of a filter of the invention with a change of data rate, and with data shared between branches, there being a flow of coefficients.

FIG. 5 is a block diagram of a filter of the invention that incorporates a change in clock rate and that has data shared between branches, with there being a flow of coefficients. This figure serves to improve understanding of the method of the invention.

As it arrives, the sampled data x(n) reaching the input I of the filter at an input sampling rate Fe is shared over the Q branches of the filter by means of a demultiplexer or switch S, with the data being stored in Q first-in-first-out (FIFO) type buffer memories or shift registers MB(0), MB(1), . . . , MB(Q-1).

In the second case, the memory must necessarily be associated with registers associated with each of the branches.

The filter coefficients g'(0), g'(1), . . . , g'(Q-1) are also stored in coefficient memories MC(1), MC(2), . . . , MC(Q-1) which may be distinct memories or merely memory zones in a memory of sufficient capacity.

The multiplications are clocked at the rate (L/M)Fe, and at each period of this clock, the filter coefficients are changed by readdressing the coefficient memory. However, the input data samples are quasi-stable and remain present in the same branch of the filter throughout the clock period Fe/Q. When all of the multiplications required on any one data sample have been performed, after a period of $INT[(N/M)Fs] \approx Fe/Q$, then the input data is updated. This near stability of data samples relative to the branches of the filter is compensated by sets of coefficients flowing in the branches.

Rules can be given to determine which coefficients and which data samples are addressed to be multiplied together at any given instant. Using the notation $N \approx Q \cdot L$, i.e. the number N of coefficients in the filter h(n) is a multiple of the interpolation ratio L, associating a data sample in a single branch of the filter amounts to installing processing whereby a given data sample x(n) is used N/M times (in fact by one of the integer values on either side of N/M). However, the value of each coefficient applied to a given data sample x(n) changes on each cycle of the clock Fs.

In a single branch, the index of the coefficient applied at each period of the clock Fs can be computed using the following formula:

$$i_Q(n+1) = i_Q(n) + M \oplus N$$

From one branch to the next, the index applied at a given moment n is decremented by L:

$$i_Q(n) = i_{Q-1}(n) - L \oplus N$$

By using the above relationships, it is shown that the sequence of indices on a given branch is of finite length regardless of the values of L and of M, and that this length is less than or equal to N. This means that a new data sample x(n) is applied each time that the coefficient index computation exceeds the value N, and this corresponds to applying a new subset of coefficients $g_m$ of the filter h(n) to the data sample x(n+Q).

The method of the present invention has, amongst others, the two following major advantages:
1) total independence between the input sampling clock Fe and the output sampling clock Fs; and
2) no flow of data between the various branches of the filter.

Each input data sample is applied to a single branch of the filter at the same rate as the data samples arrive. The FIFO memory or shift register associated with each branch of the filter serves to release the filter of synchronism constraints between the input sampling clock Fe and the output sampling clock Fs, as exist in prior art filters. Input data samples x(n) are taken into account under the control of the filter itself, as is the selection of data samples for processing purposes. The processing frequency and the clock frequency of the internal operations of the filter is the output frequency Fs.

Figure 6:
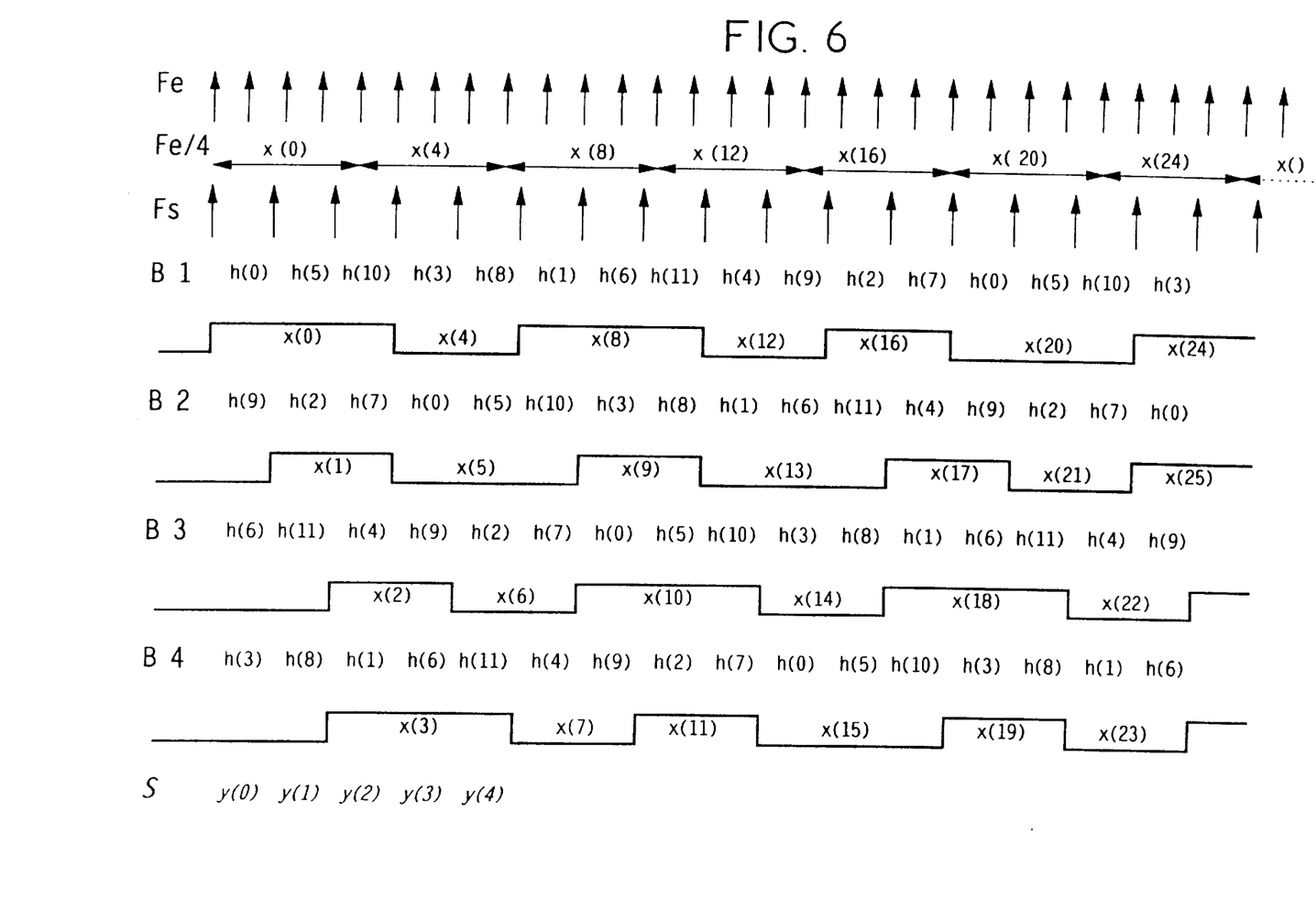
FIG. 6 is a diagram showing the principle on which digital processing of the invention is based, with the sampling rate being reduced by a factor of 3/5, using Q=4 branches and N=12 coefficients.

FIG. 6 is a diagram showing a theoretical example of filter processing according to the invention, with the sampling rate being reduced by a factor 3/5, with Q=4 branches, and N=12 coefficients, and it serves to improve understanding of the above explanation given with reference to FIG. 5. The mean period for which a given data sample is used is N/M=12/5, i.e. two or three periods of Fs.

FIG. 6 shows by way of example a set of timing diagrams to give the time relationships between the various operations which are performed while a digital filter is operating in accordance with the method of the invention. In the first timing diagram at the top of the figure, there can be seen a sequence of clock pulses at the input sampling frequency Fe. At each clock pulse, an input data sample x(n) is sampled and delivered to one of the Q branches of the filter where it is stored in a buffer memory or shift register MB(0), . . . , MB(Q1).

A data sample x(n) remains available in one branch for a period of Fe/Q. This is shown by the second timing diagram for Q=4 branches. The first data sample x(0) remains on the first branch for Fe/Q=Fe/4. After Q=4 periods of the clock Fe; the following data sample x(4) is made available on the first branch by the shift register MB(0), and this continues for four clock periods, and so on. Data samples between x(0) and x(4) are shared over the other Q-1=3 branches of the filter, where similar timing diagrams govern use thereof in succession.

The next timing diagram shows the output frequency Fs which is smaller than Fe by a factor 3/5. All of of filter multiplications are performed at this output frequency Fs, as shown by the following timing diagrams.

The next four timing diagrams show how multiplications are performed in the four branches B1, B2, B3, and B4 of the filter, where multiplications are indicated by the simultaneous presence of a coefficient h(n) and of an input data sample x(n) at a moment n. For example, for the first branch B1, it can be seen that the coefficients h(0), h(5), h(10), h(3), . . . are delivered in succession by addressing the coefficient memory at the clock rate of the output frequency Fs. The first data sample x(0) remains present during four clock periods at the input frequency Fe, which corresponds to the first three multiplications, i.e. by h(0), h(5), and h(10). The second data sample x(4) remains available during four clock periods at the input frequency Fe, which corresponds to the next two multiplications at the output frequency, i.e. multiplications by h(3) and h(8).

These timing diagrams illustrate visually the rules given above for sharing input data samples over the branches of the filter at the rate of the input frequency Fe, for the flow of coefficients at the rate of the output frequency Fs, for the shifting of the data samples in the shift registers, for the multiplications at the rate of the output frequency Fs, and finally for the output filtered data samples y(0), y(1), y(2), . . . which are delivered at the rate of the output frequency Fs.

Figure 7:
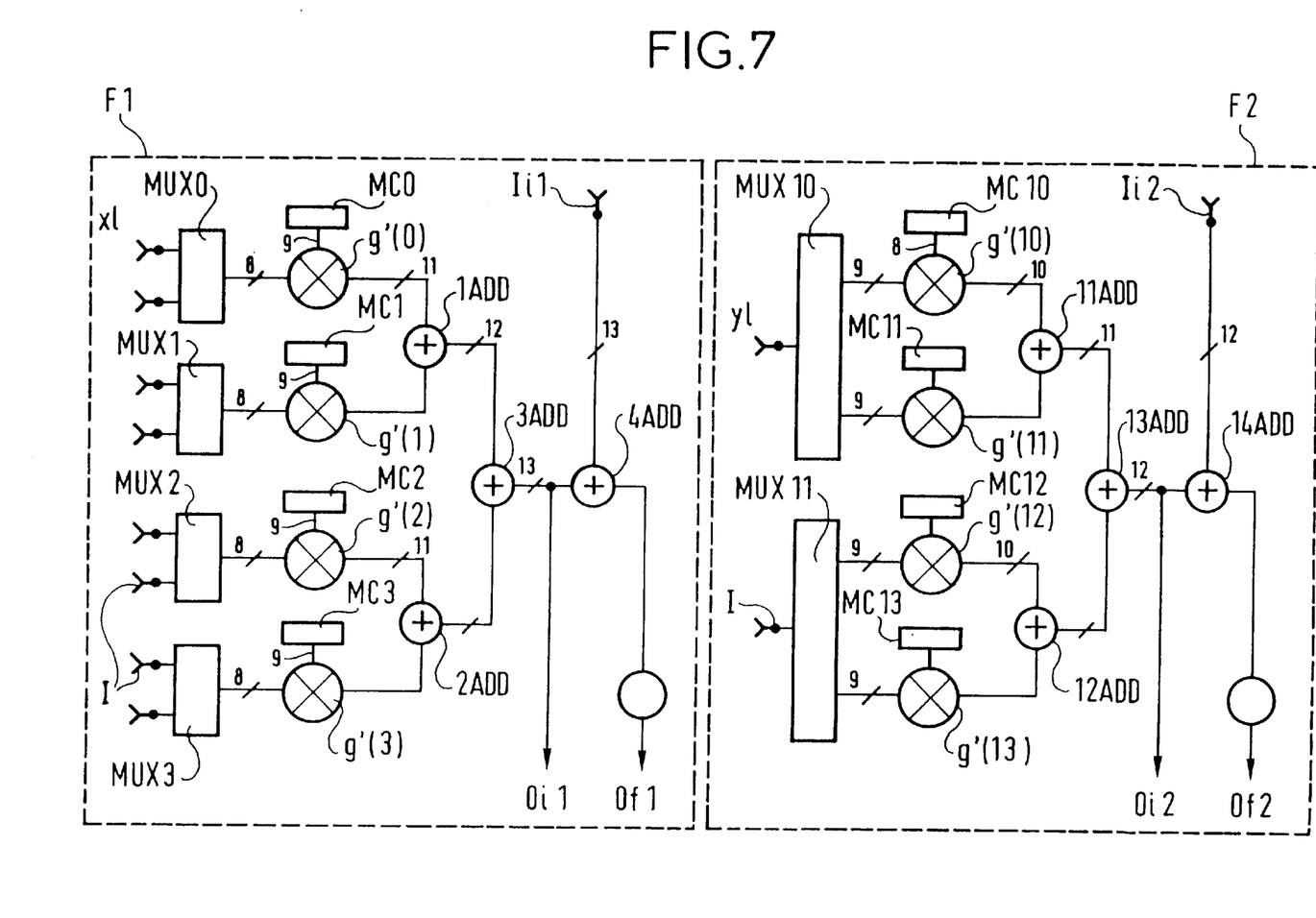
FIG. 7 is a diagrammatic plan view of an example of the invention of an integrated circuit having two filters in cascade, each filter having four branches.

FIG. 7 is a diagrammatic plan view of an embodiment of the invention in the form of an integrated circuit comprising two filters F1 and F2 connected in cascade and each having four branches. The circuit shown has been implemented using CMOS technology on a 30,000-gate ASIC, and has been designed so as to be capable of being cascaded and connected in parallel in fours. By connecting this circuit in parallel it is possible, for example, to process a signal having a bandwidth of 70 MHz sampled at a frequency of 250 MHz.

On the left there can be seen the input I of the first filter F1 which consists in a first bank of multiplexers MUX0, MUX1, MUX2, MUX3 and the input data is sampled on 8 bits. The buffer memories are upstream and are not shown in this circuit. For each link in the circuit, the number of code bits is given. The multiplexers are connected via 8-bit links to multipliers g'(0), g'(1), g'(2), and g'(3). The second inputs of the multipliers are connected to coefficient memories (RAM), MC0, MC1, MC2, and MC3 via 9-bit links. The products at the outputs from the multipliers are encoded on 11 bits. Three adder stages (1ADD, 2ADD, 3ADD) serve to sum eight stages of the first filter (four stages of the ASIC shown plus four additional stages coming from an associated ASIC).

The output from the stage F1 is thus delivered on an intermediate computation output Oi1, upstream from a last adder 4ADD which serves to add from an intermediate computation input Ii1 the products of filtering coming from other stages of the filter (not shown, 13 bits) to the products (13 bits) of the present stage F1. The final result on the final output Of1 is obtained after rounding to 9 bits.

On the left there can be seen the input I of the second filter F2 which comprises a first bank of multiplexers MUX10, MUX11, with 9-bit inputs coming from the preceding stage F1. The multiplexers are connected via 9-bit links to multipliers g'(10), g'(11), g'(12), and g'(13). These multipliers are likewise connected via their respective other inputs to coefficient memories (RAM) MC10, MC11, MC12, MC13 via 8-bit links. The products output by the multipliers are supplied on 10-bit links and are added together (11ADD, 12ADD, 13ADD) in the same manner as for the filter F1. The intermediate computation is encoded on 12 bits.

The output from stage F2 is delivered on an intermediate computation output Oi2 upstream from a last adder 14ADD having an input connected to an intermediate computation input Ii2 for the purpose of adding in the filter products coming from other stages of the filter (not shown, 12 bits) with the products (12 bits) of the present stage F2. The final result on the final output Of2 is obtained after rounding to 8 bits.

Figure 8:
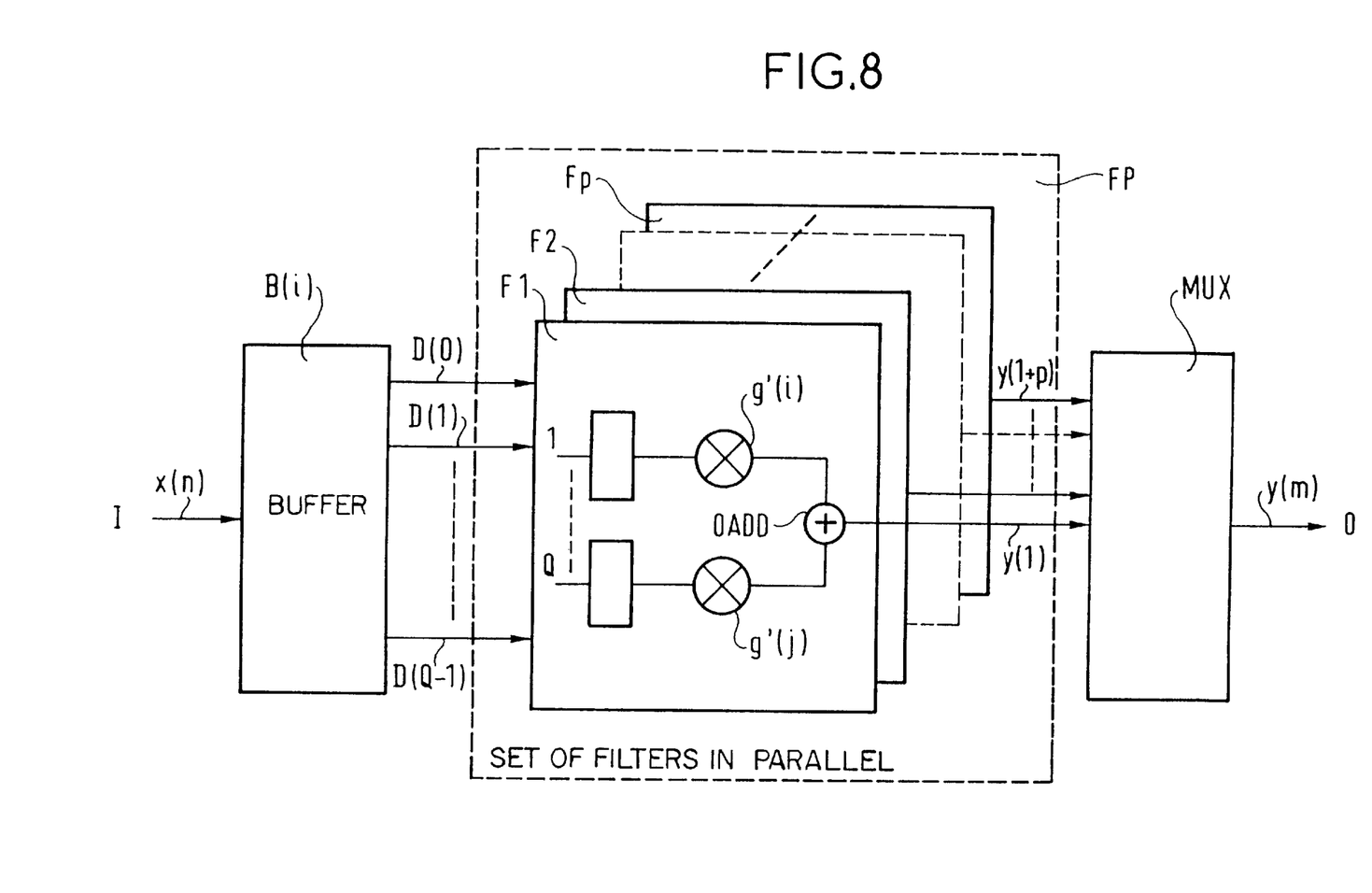
FIG. 8 is a diagrammatic perspective view showing P filters of FIG. 5 connected in parallel.

The intermediate inputs and outputs shown for this circuit make it easy to connect in parallel. FIG. 8 is a diagrammatic perspective view of P FIG. 5 filters connected in parallel. Upstream from the parallel filter FP, the input I of the data x(n) sampled at the input sampling frequency Fe is connected to a buffer memory B(i) which, in the example shown in FIG. 8, is a memory of sufficient capacity to serve all of the branches in all of the planes of the parallel filter FP. The data samples are supplied by said buffer memory B(i) via links D(0), D(1), . . . , D(Q-1) to the Q inputs of the Q branches in each plane in application of the same rules as in the examples given above, with the exception that the processing frequency is divided by the number p of planes in the parallel filter FP: Fs=Fe(L/pM).

To optimize the processing speed to the bandwidth B to be processed, it is advantageous to select a degree of parallelization p which is a submultiple of the number of branches in the filter, thereby simplifying the distribution of coefficients between the various planes in parallel. This parallel architecture is completely synchronous.

In FIG. 8, the first plane F1 is a highly diagrammatic representation of a filter of the invention as shown in FIG. 7, so it is not described again. All the other planes F2, . . . , Fp are similar and they are not described in greater detail. Each plane F1, F2, . . . , Fp provides an output y(1), y(2), y(3), . . . , y(1+p) associated with the p respective inputs of a multiplexer MUX external to the filter which provides at its output the filtered data y(m) at the rate of the output frequency Fs=Fe(L/M).

Figure 9:
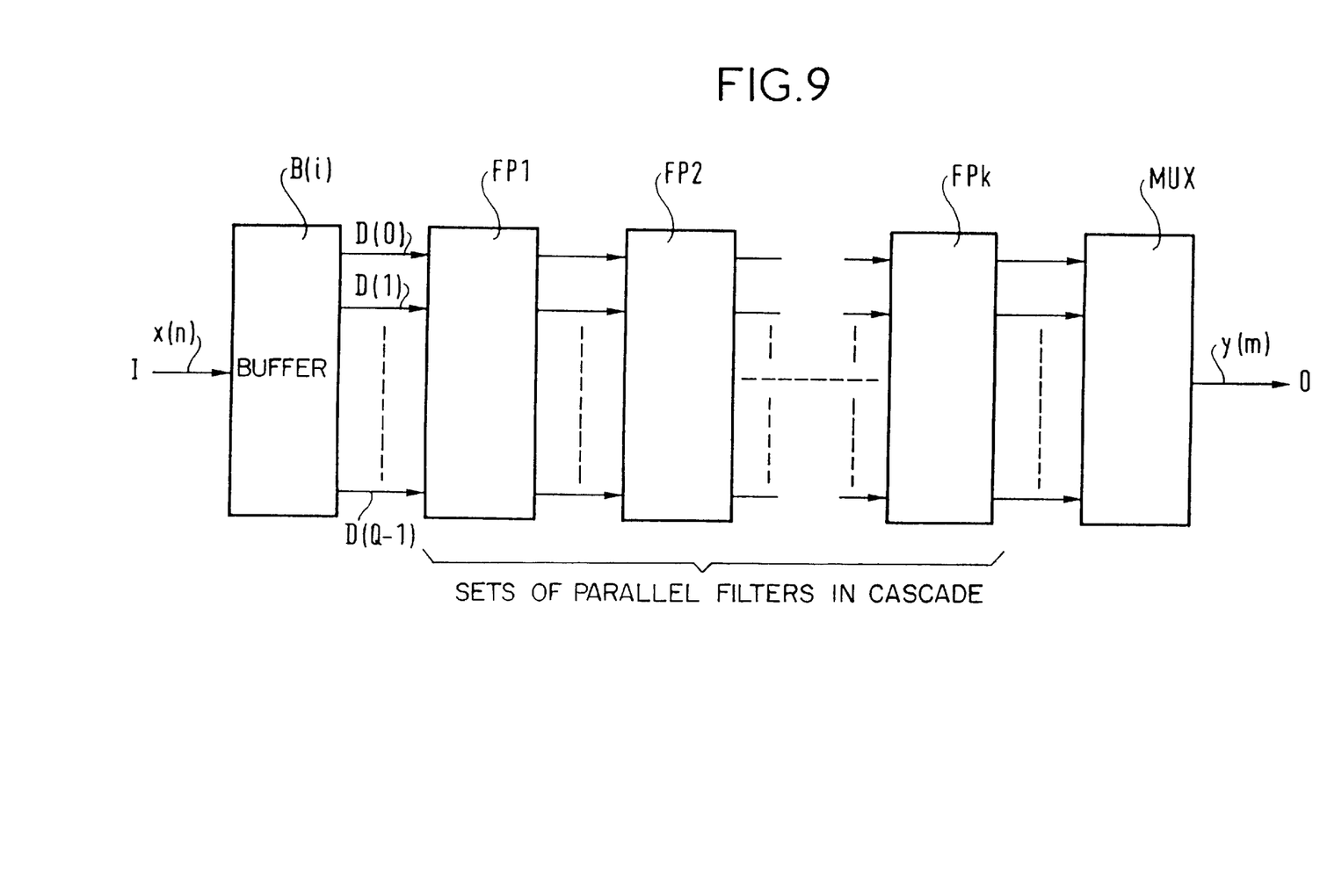
FIG. 9 is a block diagram showing parallel filters of FIG. 8 connected in cascade.

FIG. 9 is a block diagram showing a cascade of parallel filters as shown in FIG. 8. Upstream from the first parallel filter FP1, the input I for data x(n) sampled at the input sampling frequency Fe is connected to a buffer memory B(i) which, as in the example of FIG. 8, is a memory of sufficient capacity to serve all of the branches of all of the planes of the parallel filter FP1. The data is supplied by said buffer memory B(i) via links D(0), D(1), . . . , D(Q-1) to the Q inputs of the Q branches of each plane in application of the same rules as in FIG. 8. The processing frequency is the same as in FIG. 8: Fs=Fe(L/pM).

The p parallel outputs of data y(1), y(2), . . . , y(1+p) are connected directly to the p inputs of the following stage FP2, and so on. In all, k parallel filters FP1, FP2, . . . , FPk are cascaded in this way. At the end of the change, the p outputs of the last filter FPk are multiplexed by multiplexer MUX to deliver the filtered data y(m) at the rate of the output frequency Fs =Fe(L/M).

Studies have shown us that it is possible to optimize the number of coefficients required for given filter characteristics by cascading a plurality of parallel filters. The advantage of this cascade structure naturally resides in matching the number of inputs of a filter to the number of outputs to the preceding filter, as described above.

Finally, the advantage of synchronous operation is conserved. It suffices for the working frequency of the filters to be the output frequency from the first filter Fs=Fe($L_1/M_1$).

The output frequency of the cascaded filters is constructed using the technique of cycle violation. This technique makes it possible to conserve synchronous processing. The sequences of filter coefficients are constructed to take advantage of such idle times. Similarly valid output samples are marked by a validation signal.

We claim:

1. A digital filter method comprising the following steps:

input signal data x(n) is sampled at the input sampling frequency Fe and is shared between and stored in a plurality of Q memories of shift register or FIFO type, respectively associated with the Q branches of the filter;

the filter coefficients $g_m(p)$ are stored in at least one other memory referred to as a "coefficient" memory;

interpolation by L is performed on each branch;

said data samples x(n) are multiplied by the said coefficients $g_m(p)$ at the rate of the output frequency Fs; and decimation by M, enabling the working frequency of the filter to be lowered to the output frequency Fs=(L/M) Fe, where L and M are integers and L/M<1.

2. A method according to claim 1, wherein said data samples x(n) in each branch remain present for a plurality ≈Fe/Q of multiplications and coefficients are rotated in each branch by permutation of addresses in said coefficient memory at each clock period.

3. A method according to claim 1, wherein said multiplications are performed in parallel on a plurality $\underline{p}$ of filter planes, each filter plane having Q branches, said $\underline{p}$ filter planes being connected in a parallel architecture, thereby enabling the working frequency of the filter to be lowered to the output frequency Fs=(L/pM)Fe with synchronous sequencing between the parallel filters.

4. A method according to claim 3, wherein said multiplications are formed in cascade by a plurality $\underline{k}$ of parallel filters, each parallel filter comprising $\underline{p}$ planes, said parallel filters being connected in series, the $\underline{p}$ outputs from each preceding parallel filter being connected to the $\underline{p}$ inputs of each following parallel filter in the cascade.

5. Digital filter architecture comprising:

means for sharing input sampled data x(n);

means for temporary storage of said input data x(n), e.g. a plurality Q of memories of shift register or FIFO type;

Q branches of the filter;

at least one other memory referred to as a "coefficient" memory for storing filter coefficients $g_m(p)$;

means for multiplying data x(n) by the coefficients $g_m(p)$;

means for performing interpolation by L;

means for decimation by M, with integer L and M and with L/M<1;

said temporary storage means for said input data being associated respectively with said Q branches of said filter to provide said data to said multiplication means;

said at least one coefficient memory being connected to said multiplication means to supply said coefficients to said multiplication means; and said multiplication means outputting filtered data y(m).

6. Parallel digital filter architecture comprising a plurality of filters according to claim 5 connected in parallel.

7. Cascaded digital filter architecture comprising a plurality of filters according to claim 5.

8. A digital filter circuit according to the architecture of claim 5 for implementing a method according to claim 1.

* * * * *